US012745483B1

(12) United States Patent
Wang et al.

(10) Patent No.: US 12,745,483 B1
(45) Date of Patent: Sep. 22, 2026

(54) SOLAR CELL AND PHOTOVOLTAIC MODULE

(71) Applicant: ZHEJIANG JINKO SOLAR CO., LTD., Haining (CN)

(72) Inventors: Zhao Wang, Haining (CN); Yuanfang Zhang, Haining (CN); Peiting Zheng, Haining (CN); Jie Yang, Haining (CN); Xinyu Zhang, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/261,312

(22) Filed: Jul. 7, 2025

(30) Foreign Application Priority Data

Jun. 3, 2025 (CN) ........................ 202510732516.3

(51) Int. Cl.
*H10F 77/14* (2025.01)
*H10F 77/20* (2025.01)

(52) U.S. Cl.
CPC ........... *H10F 77/14* (2025.01); *H10F 77/211* (2025.01)

(58) Field of Classification Search
None
See application file for complete search history.

(56) References Cited

U.S. PATENT DOCUMENTS 6,429,037 B1 8/2002 Wenham et al.
8,288,193 B2 * 10/2012 Wu ...................... H10F 71/121 438/69
2013/0157401 A1 6/2013 Jäger et al.
2013/0327381 A1 * 12/2013 Chung .................. H10F 71/128 136/255
2017/0207356 A1 * 7/2017 Adachi ................... H10F 19/80
(Continued)

FOREIGN PATENT DOCUMENTS

CN 102194877 A 9/2011
CN 103390659 A 11/2013
CN 104956495 A 9/2015
(Continued)

OTHER PUBLICATIONS

Extended European Search Report received in corresponding Application No. EP 25187257.8, dated Nov. 21, 2025, 9 pages.
(Continued)

*Primary Examiner* — Dustin Q Dam
(74) *Attorney, Agent, or Firm* — Dority & Manning, PA

(57) ABSTRACT

Disclosed are a solar cell and a photovoltaic module. The solar cell includes a substrate, an emitter structure, a doped conductive structure, a first electrode and a second electrode. The emitter structure is disposed on a first surface of the substrate and includes a first heavily doped region and a first lightly doped region arranged alternately. The doped conductive structure is disposed on a second surface of the substrate, includes a second heavily doped region and a second lightly doped region arranged alternately. A first electrode is disposed at least on the first heavily doped region. A second electrode is disposed at least on the second heavily doped region. A doping concentration index of the first heavily doped region is greater than that of the first lightly doped region, and a doping concentration index of the second heavily doped region is greater than that of the second lightly doped region.

19 Claims, 7 Drawing Sheets

(56) References Cited

U.S. PATENT DOCUMENTS

2019/0088805 A1* 3/2019 Jin .......................... H10F 77/215

FOREIGN PATENT DOCUMENTS

| | | | | |
|---|---|---|---|---|
| CN | 106876488 A | | 6/2017 | |
| CN | 107148677 A | | 9/2017 | |
| CN | 107980181 A | | 5/2018 | |
| CN | 110957382 A | | 4/2020 | |
| CN | 114156361 A | | 3/2022 | |
| CN | 114242803 A | | 3/2022 | |
| CN | 114695578 A | | 7/2022 | |
| CN | 115000213 A | | 9/2022 | |
| CN | 217606835 U | | 10/2022 | |
| CN | 116259679 A | | 6/2023 | |
| CN | 117393647 A | * | 1/2024 | H10F 10/14 |
| CN | 117810274 A | | 4/2024 | |
| CN | 118053930 A | * | 5/2024 | H10P 34/42 |
| CN | 118398674 A | | 7/2024 | |
| CN | 119744027 A | | 4/2025 | |
| CN | 119744028 A | | 4/2025 | |

OTHER PUBLICATIONS

Tam et al., “Design of Selective Emitter Profiles for High Efficiency Solar Cells under Manufacturing Technology Constraints”, 43rd Photovoltaic Specialists Conference, Jun. 5, 2016, pp. 2525-2530.

Decision to Grant (with English translation) received in corresponding Application No. CN 202510732516.3, dated Jul. 11, 2025, 10 pages.

Notification to Grant Patent Right for Invention (with English translation) received in corresponding Application No. CN 202510732516.3, dated Jul. 11, 2025, 2 pages.

Office Action received in corresponding Application No. CN 202511135172.4, dated May 23, 2026, 12 pages.

* cited by examiner

SOLAR CELL AND PHOTOVOLTAIC MODULE

CROSS-REFERENCE TO RELATED APPLICATIONS

This application claims priority to a Chinese patent application No. 202510732516.3, filed with China National Intellectual Property Administration on Jun. 3, 2025, and entitled “Solar Cell and Photovoltaic Module”, which is hereby incorporated by reference in its entirety.

TECHNICAL FIELD

The present application relates to the field of solar cell technology, and in particular to a solar cell and a photovoltaic module.

BACKGROUND

A solar cell is a device that directly converts light energy into electrical energy based on the photoelectric effect or photochemical effect. With the continuous development of solar cells, higher requirements are proposed for the photoelectric conversion efficiency of solar cells. Therefore, how to improve the photoelectric conversion efficiency of solar cells has become an urgent problem to be solved.

SUMMARY

The invention provides a solar cell and a photovoltaic module.

In one aspect of the invention, a solar cell is provided, including a substrate, an emitter structure, a doped conductive structure, a first electrode, and a second electrode. The substrate has a first surface and a second surface arranged opposite to each other along a thickness direction of the substrate. The emitter structure, arranged on the first surface of the substrate, and comprising a first heavily doped region and a first lightly doped region arranged alternately. The doped conductive structure, disposed on the second surface of the substrate, and comprising a second heavily doped region and a second lightly doped region alternately arranged; the second heavily doped region, the second lightly doped region and the substrate having the same conductivity type. The first electrode disposed at least on the first heavily doped region of the emitter structure and electrically connected to the first heavily doped region. The second electrode disposed at least on the second heavily doped region of the doped conductive structure and electrically connected to the second heavily doped region. A doping concentration index of the first heavily doped region is greater than a doping concentration index of the first lightly doped region; the doping concentration index of the first heavily doped region is a ratio of an average doping concentration of the first heavily doped region within a preset depth range to a doping concentration of the substrate, and the doping concentration index of the first lightly doped region is a ratio of an average doping concentration of the first lightly doped region within the preset depth range to the doping concentration of the substrate. A doping concentration index of the second heavily doped region is greater than a doping concentration index of the second lightly doped region; the doping concentration index of the second heavily doped region is a ratio of an average doping concentration of the second heavily doped region within the preset depth range to the doping concentration of the substrate, and the doping concentration index of the second lightly doped region is a ratio of an average doping concentration of the second lightly doped region within the preset depth range to the doping concentration of the substrate.

In an embodiment, the doping concentration index of the first heavily doped region is in a range from 10 to 1×107, and the doping concentration index of the first lightly doped region is in a range from 1 to 100. The doping concentration index of the second heavily doped region is in a range from 10 to 1×107, and the doping concentration index of the second lightly doped region is in a range from 1 to 100. The preset depth is in a range from 90 nm to 110 nm.

In an embodiment, the first heavily doped region comprises a first heavily doped sub-region, and second heavily doped sub-regions located at opposite sides of the first heavily doped sub-region respectively along a first object direction; a doping concentration index of the first heavily doped sub-region is greater than a doping concentration index of each second heavily doped sub-region; the first object direction, an extension direction of the first heavily doped region, and the thickness direction of the substrate are perpendicular to each other. The second heavily doped region comprises a third heavily doped sub-region, and fourth heavily doped sub-regions located at opposite sides of the third heavily doped sub-region respectively along a second object direction; a doping concentration index of the third heavily doped sub-region is greater than a doping concentration index of each fourth heavily doped sub-region; the second object direction, an extension direction of the second heavily doped region, and the thickness direction of the substrate are perpendicular to each other.

In an embodiment, the doping concentration index of the first heavily doped sub-region is in a range from 10 to $1\times10^7$, and the doping concentration index of the second heavily doped sub-region is in a range from 5 to $5\times10^6$; and/or the doping concentration index of the third heavily doped sub-region is in a range from 10 to $1\times10^7$, and the doping concentration index of each fourth heavily doped sub-region is in a range from 5 to $5\times10^6$.

In an embodiment, the first heavily doped region is closer to the second surface than the first lightly doped region along the thickness direction of the substrate; or the first heavily doped region is farther away from the second surface than the first lightly doped region along the thickness direction of the substrate; or a side of the first heavily doped region away from the second surface is flush with a side of the first lightly doped region away from the second surface along the thickness direction of the substrate.

In an embodiment, a distance, along the thickness direction of the substrate and between the side of the first heavily doped region away from the second surface and the side of the first lightly doped region away from the second surface, is a first distance, and the first distance is in a range from 1 μm to 10 μm.

In an embodiment, the second heavily doped region is closer to the first surface than the second lightly doped region along the thickness direction of the substrate; or the second heavily doped region is farther away from the first surface than the second lightly doped region along the thickness direction of the substrate; or a side of the second heavily doped region away from the first surface is flush with a side of the second lightly doped region away from the first surface along the thickness direction of the substrate.

A distance, along the thickness direction of the substrate and between the side of the second heavily doped region away from the first surface and the side of the second lightly doped region away from the first surface, is a second distance, and the second distance is in a range from 1 μm to 10 μm.

The first heavily doped region and the first lightly doped region are both configured to extend along one of a first direction and a second direction, and the first heavily doped region and the first lightly doped region are alternately arranged along the other of a first direction and a second direction; and/or the second heavily doped region and the second lightly doped region are both configured to extend along one of a first direction and a second direction, and the second heavily doped region and the second lightly doped region are alternately arranged along the other of the first direction and the second direction. The first direction and the second direction intersect each other and are both perpendicular to the thickness direction of the substrate.

In an embodiment, each of the first heavily doped region, the first lightly doped region, the second heavily doped region, and the second lightly doped region is configured to extend along the first direction; the first heavily doped region and the first lightly doped region are alternately arranged along the second direction, and the second heavily doped region and the second lightly doped region are alternately arranged along the second direction; the first heavily doped region and the second heavily doped region are arranged in a staggered pattern along the second direction; and the first lightly doped region and the second lightly doped region are arranged in a staggered pattern along the second direction; or each of the first heavily doped region, the first lightly doped region, the second heavily doped region, and the second lightly doped region is configured to extend along the second direction; the first heavily doped region and the first lightly doped region are alternately arranged along the first direction, and the second heavily doped region and the second lightly doped region are alternately arranged along the first direction; the first heavily doped region and the second heavily doped region are arranged in a staggered pattern along the first direction; and the first lightly doped region and the second lightly doped region are arranged in a staggered pattern along the first direction.

In an embodiment, the substrate further has side surfaces each connected between the first surface and the second surface; and at least one of the first heavily doped region and the second heavily doped region is configured to extend to each side surface and connected to each side surface.

In an embodiment, at least one of limitations that a portion of the first heavily doped region extending to a corresponding side surface is adapted to extend from a side proximate to the first surface to a side proximate to the second surface, or that a portion of the second heavily doped region extending to a corresponding side surface is adapted to extend from a side proximate to the second surface to a side proximate to the first surface, is satisfied.

In an embodiment, at least one of limitations that the portion of the first heavily doped region extending to the corresponding side surface is arranged to surround the corresponding side surface, or that the portion of second heavily doped region extending to the corresponding side surface is arranged to surround the corresponding side surface, is satisfied.

In an embodiment, the emitter structure comprises a plurality of first heavily doped regions and a plurality of first lightly doped regions, and the doped conductive structure comprises a plurality of second heavily doped regions and a plurality of second lightly doped regions. The plurality of first heavily doped regions and the plurality of first lightly doped regions are alternately arranged along a first object direction; the first object direction, an extension direction of the first heavily doped regions, and the thickness direction of the substrate are perpendicular to each other; there is a first central heavily doped region among the plurality of first heavily doped regions 210; D1 denotes a dimension of the first central heavily doped region along the first object direction, and D2 denotes a dimension of each of remaining first heavily doped regions among the plurality of first heavily doped regions except the first central heavily doped region along the first object direction, and it is satisfied that D1> D2. The plurality of second heavily doped regions and the plurality of second lightly doped regions are alternately arranged along a second object direction; the second object direction, an extension direction of the second heavily doped region, and the thickness direction of the substrate are perpendicular to each other; there is a second central heavily doped region among the plurality of second heavily doped regions; D3 denotes a dimension of the second central heavily doped region along the second object direction, and D4 denotes a dimension of each of remaining second heavily doped regions among the plurality of second heavily doped regions except the second central heavily doped region along the second object direction, and it is satisfied that D3>D4.

In an embodiment, the emitter structure comprises a plurality of first heavily doped regions and a plurality of first lightly doped regions, and the doped conductive structure comprises a plurality of second heavily doped regions and a plurality of second lightly doped regions. S1 denotes a sum of orthographic projection areas of the plurality of first heavily doped regions on the substrate, and S2 denotes a sum of orthographic projection areas of the plurality of first lightly doped regions on the substrate; S1 and S2 have the same unit, and S1 and S2 satisfy that S1/S2=a1, and a1 is in a range from 10% to 50%; and/or S3 denotes a sum of orthographic projection areas of the plurality of second heavily doped regions on the substrate, and S4 denotes a sum of orthographic projection areas of the plurality of second lightly doped regions on the substrate; S3 and S4 have the same unit, and S3 and S4 satisfy that S3/S4=a2, and a2 is in a range from 10% to 50%.

In the other aspect, the invention provides a photovoltaic module, including the solar cell of any one of the embodiments.

DETAILED DESCRIPTION OF THE EMBODIMENTS

Figure 1:
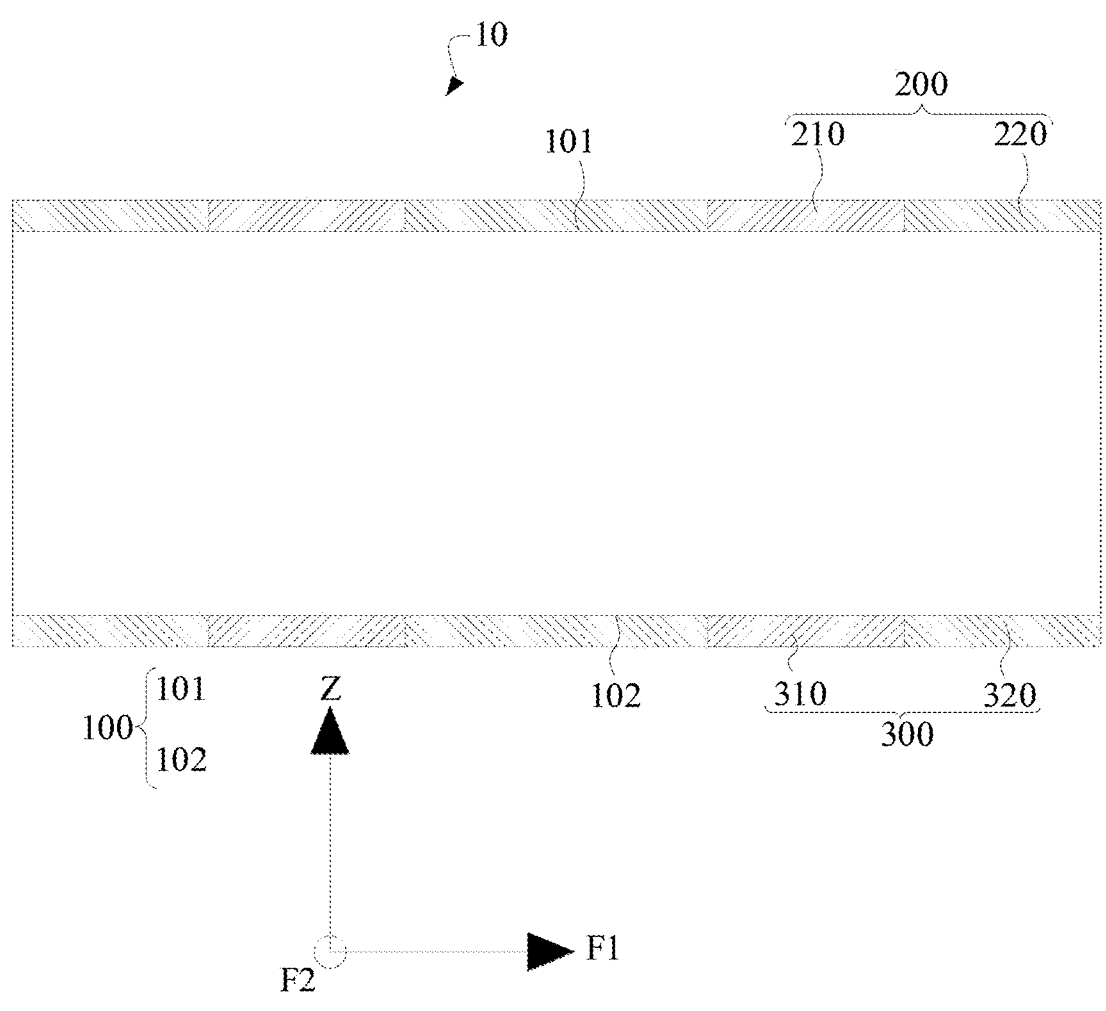
FIG. 1 is a schematic view showing partial structure of a solar cell according to an embodiment of the present application.

In order to make the above objectives, features and advantages of the present application clearer and better understood, specific implementations of the present application are described in detail hereinafter with reference to the accompanying drawings. In the following description, many specific details are set forth to make the present application to be fully understood. However, the present application can be implemented in many other ways different from those described herein, and those skilled in the art can make similar improvements without departing from the connotation of the present application. Therefore, the present application is not limited by the specific embodiments disclosed below.

In the description of the present application, it should be understood that if the terms "center", "longitudinal", "transverse", "length", "width", "thickness", "upper", "lower", "front", "rear", "left", "right", "vertical", "horizontal", "top", "bottom", "inner", "outer", "clockwise", "counter-clockwise", "axial", "radial", "circumferential", etc. are described, the orientation or position relationships indicated by these terms are based on the orientation or position relationships shown in the accompanying drawings and are merely intended to facilitate the description of the present application and simplify the description, rather than indicating or implying that the indicated device or element must have a particular orientation or be constructed and operated in a particular orientation, and therefore are not to be interpreted as limitations on the present application.

In addition, if the terms "first" and "second" are described, these terms are used for descriptive purposes only but cannot be interpreted as indicating or implying relative importance or implicitly specifying the number of indicated technical features. Thus, the features defined as "first" and "second" may explicitly or implicitly include at least one of these features. In the description of the present application, if the term "plurality" is described, the "plurality" means at least two, such as two, and three, etc., unless otherwise clearly and specifically defined.

In the present application, unless otherwise clearly specified and limited, if the terms "mount", "connection", "communication", "fix", etc., are described, these terms should be understood in a broad sense, for example, may be a fixed connection or a detachable connection, or an integrated connection; or may be a mechanical connection or an electrical connection; or may be a direct connection or an indirect connection through an intermediate medium; or may be an internal communication between two elements or an interaction relationship between two elements, unless otherwise clearly defined. Those of ordinary skill in the art can understand the specific meanings of the above terms in the present application according to specific situations.

In the present application, unless otherwise clearly specified and limited, if there is a description that a first feature is "above" or "under" a second feature, etc., or similar description, it may mean that the first and second features are in direct contact, or the first and second features are in indirect contact through an intermediate medium. Moreover, the first feature being "on top of", "above" and "over" the second feature may mean that the first feature is directly above or obliquely above the second feature, or simply means that the horizontal height of the first feature is greater than that of the second feature. The first feature being "under", "beneath" and "below" the second feature may mean that the first feature is directly below or obliquely below the second feature, or simply means that the horizontal height of the first feature is less than the second feature.

It should be noted that if an element is referred to as being "fixed to" or "disposed on" another element, the element may be directly on the other element or there may be an intermediate element. If an element is considered to be "connected to" another element, the element may be directly connected to the other element or there may be an intermediate element as well. If any, the terms "vertical", "horizontal", "upper", "lower", "left", "right" and similar expressions used in this application are for illustrative purposes only and do not represent the only embodiment.

FIG. 1 to FIG. 6 are schematic views showing partial structures of a solar cell 10 according to different embodiments of the present application.

As shown in FIG. 1 to FIG. 6, each embodiment of the present application provides a solar cell 10, including a substrate 100, an emitter structure 200, a doped conductive structure 300, a first electrode 400, and a second electrode 500.

Along a thickness direction Z of the substrate 100, the substrate 100 has a first surface 101 and a second surface 102 arranged opposite to each other. The substrate 100 has a first conductivity type. The emitter structure 200 is disposed on the first surface 101 of the substrate 100, and the emitter structure 200 includes a first heavily doped region 210 and a first lightly doped region 220 arranged alternately.

The emitter structure 200 is disposed on the first surface 101 of the substrate 100. In an embodiment, at least a portion of the emitter structure 200 is disposed on a side of the first surface 101 of the substrate 100 facing away from the second surface 102. Alternatively, at least a portion of the emitter structure 200 is disposed on a side of the first surface 101 of the substrate 100 proximate to the second surface 102. That is, at least a portion of the emitter structure 200 is disposed on the upper surface layer of the substrate 100, which is not specifically limited herein.

One of the first surface 101 and the second surface 102 is a front surface, and the other of the first surface 101 and the second surface 102 is a back surface. Exemplarily, the first surface 101 is the front surface, and the second surface 102 is the back surface.

The conductivity type of the emitter structure 200 is opposite to the conductivity type of the substrate 100. The emitter structure 200 is a structure arranged on the first surface 101 of the solar cell 10 and adapted to be electrically connected to the first electrode 400 and having a conductivity type opposite to that of the substrate 100.

The first heavily doped region 210 is a region with a relatively high doping concentration index on the emitter structure 200, and mainly plays a role of photogenerated carrier separation and light absorption.

The first lightly doped region 220 is a region with a relatively low doping concentration index or even with a doping concentration index as low as 1 on the emitter structure 200, and mainly plays the role of light absorption and carrier transmission.

The doped conductive structure 300 is disposed on the second surface 102 of the substrate 100, and includes a second heavily doped region 310 and a second lightly doped region 320 alternately arranged, and the second heavily doped region 310 and the second lightly doped region 320 have the first conductivity type. That is, the second heavily doped region 310, the second lightly doped region 320, and the substrate 100 have the same conductivity type.

The doped conductive structure 300 is disposed on the second surface 102 of the substrate 100. In an embodiment, at least a portion of the doped conductive structure 300 is disposed on a side of the second surface 102 of the substrate 100 facing away from the first surface 101. Alternatively, at least a portion of the doped conductive structure 300 is disposed on a side of the second surface 102 of the substrate 100 proximate to the first surface 101. That is, at least a portion of the doped conductive structure 300 is disposed on the lower surface layer of the substrate 100, which is not limited specifically herein.

In an embodiment, the conductivity type of substrate 100 is N-type, the conductivity type of the doped conductive structure 300 is N-type, and the conductivity type of at least the first heavily doped region 210 of the emitter structure 200 is P-type. Alternatively, the conductivity type of the substrate 100 is P-type, the conductivity type of the doped conductive structure 300 is P-type, and the conductivity type of at least the first heavily doped region 210 of the emitter structure 200 is N-type.

The conductivity type of at least the first heavily doped region 210 of the emitter structure 200 being P-type may mean that the conductivity type of the first heavily doped region 210 is P-type, and the first lightly doped region 220 is not P-type doped; or may mean that the conductivity types of the first heavily doped region 210 and first lightly doped region 220 are both P-type.

Similarly, the conductivity type of at least the first heavily doped region 210 of the emitter structure 200 being N-type may mean that the conductivity type of the first heavily doped region 210 is N-type, and the first lightly doped region 220 is not N-type doped; or may mean that the conductivity types of the first heavily doped region 210 and first lightly doped region 220 are both N-type.

The second heavily doped region 310 is a region with a relatively high doping concentration index on the doped conductive structure 300, and mainly plays the role of photogenerated carrier separation and light absorption.

The second lightly doped region 320 is a region with a relatively low doping concentration index or even with a doping concentration index as low as 1 on the doped conductive structure 300, and mainly plays the role of light absorption and carrier transmission.

The first electrode 400 is disposed at least on the first heavily doped region 210 of the emitter structure 200 and electrically connected to the first heavily doped region 210. The second electrode 500 is disposed at least on the second heavily doped region 310 of the doped conductive structure 300 and electrically connected to the second heavily doped region 310.

In an embodiment, the first electrode 400 may be arranged on the first heavily doped region 210 of the emitter structure 200. For example, the first electrode 400 is a grid finger, while the first surface 101 of the solar cell 10 is not provided with a main busbar. Alternatively, a part of the first electrode 400 is arranged on the first heavily doped region 210 of the emitter structure 200, and the other part of the first electrode 400 is arranged on the first lightly doped region 220 of the emitter structure 200. For example, the first electrode 400 includes a main busbar and a grid finger, and the grid finger is arranged on the first heavily doped region 210 of the emitter structure 200, and the main busbar is cross-connected with the grid finger, so that a part of the main busbar is arranged on the first heavily doped region 210 of the emitter structure 200, and the other part of the main busbar is arranged on the first lightly doped region 220 of the emitter structure 200.

In an embodiment, the second electrode 500 may be disposed on the second heavily doped region 310 of the doped conductive structure 300. For example, the second electrode 500 is a grid finger, and the second surface 102 of the solar cell 10 is not provided with a main busbar. Alternatively, a part of the second electrode 500 is disposed on the second heavily doped region 310 of the doped conductive structure 300, and the other part of the second electrode 500 is disposed on the second lightly doped region 320 of the doped conductive structure 300.

The doping concentration index of the first heavily doped region 210 is greater than the doping concentration index of the first lightly doped region 220. The doping concentration index of the first heavily doped region 210 is a ratio of an average doping concentration of the first heavily doped region 210 within a preset depth range to the doping concentration of the substrate 100, and the doping concentration index of the first lightly doped region 220 is a ratio of an average doping concentration of the first lightly doped region 220 within a preset depth range to the doping concentration of the substrate 100.

The doping concentration index of the second heavily doped region 310 is greater than the doping concentration index of the second lightly doped region 320. The doping concentration index of the second heavily doped region 310 is a ratio of an average doping concentration of the second heavily doped region 310 within a preset depth range to the doping concentration of the substrate 100, and the doping concentration index of the second lightly doped region 320 is a ratio of an average doping concentration of the second lightly doped region 320 within a preset depth range to the doping concentration of the substrate 100.

The average doping concentration of the first heavily doped region 210 within the preset depth range is obtained as follows: obtain a relationship curve between the doping concentration of the first heavily doped region 210 and a doping depth of the first heavily doped region 210 by using an electrochemical capacitance-voltage (ECV) method, and then integrate the doping concentration within the preset depth range to obtain an integrated area, and then divide the integrated area by the preset depth to obtain the average doping concentration of the first heavily doped region 210 within the preset depth range. Alternatively, the average doping concentration of the first heavily doped region 210 within the preset depth range may be directly read by a device.

Similarly, the average doping concentration of the first lightly doped region 220 within the preset depth range, the average doping concentration of the second heavily doped region 310 within the preset depth range, and the average doping concentration of the second lightly doped region 320 within the preset depth range can be obtained.

The doping concentration index of the first heavily doped region 210 is relatively high, which is beneficial to reducing the contact resistance between the first heavily doped region 210 and the first electrode 400, thereby improving the photoelectric conversion efficiency of the solar cell 10. The doping concentration index of the first lightly doped region 220 is relatively low, so the Auger recombination of the first lightly doped region 220 is reduced and the short-wave quantum efficiency is effectively improved, thereby improving the short-circuit current and open-circuit voltage of the solar cell 10.

Similarly, the doping concentration index of the second heavily doped region 310 is relatively high, which is beneficial to reducing the contact resistance between the second heavily doped region 310 and the second electrode 500, thereby improving the photoelectric conversion efficiency of the solar cell 10. The doping concentration index of the second lightly doped region 320 is relatively low, therefore the Auger recombination of the second lightly doped region 320 is reduced and the short-wave quantum efficiency is effectively improved, thereby improving the short-circuit current and open-circuit Voltage of the solar cell 10.

In addition, the doping concentration index of the first heavily doped region 210 is the ratio of the average doping concentration of the first heavily doped region 210 within the preset depth range to the doping concentration of the substrate 100. When the doping concentration of the substrate 100 remains unchanged, if the doping concentration index of the first heavily doped region 210 is relatively high, it means that the average doping concentration of the first heavily doped region 210 within the preset depth range is relatively high. Generally, the region of the first heavily doped region 210 within the preset depth range can best reflect the electrical properties of the first heavily doped region 210, and can more evenly reflect the doping concentration of the first heavily doped region 210. Therefore, the doping concentration index of the first heavily doped region 210 being configured to be greater than the doping concentration index of the first lightly doped region 220 can better improve the photoelectric conversion efficiency of the solar cell 10 while also better improving the short-circuit current and open-circuit voltage of the solar cell 10.

Similarly, when the doping concentration of substrate 100 remains unchanged, if the doping concentration index of the second heavily doped region 310 is relatively high, it means that the average doping concentration of the second heavily doped region 310 within the preset depth range is relatively high. Generally, the region of the second heavily doped region 310 within the preset depth range can best reflect the electrical properties of the second heavily doped region 310, and can more evenly reflect the doping concentration of the first heavily doped region 210. Therefore, the doping concentration index of the second heavily doped region 310 being configured to be greater than the doping concentration index of the second lightly doped region 320 can better improve the photoelectric conversion efficiency of the solar cell 10 while also better improving the short-circuit current and open-circuit voltage of the solar cell 10.

In some embodiments, the doping concentration index of the first heavily doped region 210 is in a range from 10 to $1\times10^7$, and the doping concentration index of the first lightly doped region 220 is in a range from 1 to 100.

Exemplarily, the doping concentration index of the first heavily doped region 210 is 10, $1\times10^2$, $1\times10^3$, $1\times10^4$, $1\times10^5$, $1\times10^6$, or $1\times10^7$.

The doping concentration index of the first lightly doped region 220 may be 1, that is, the average doping concentration of the first lightly doped region 220 within the preset depth range is equal to the doping concentration of the substrate 100, or even the doping concentration of the first lightly doped region 220 is equal to the doping concentration of the substrate 100 (in this case, the first lightly doped region 220 is not doped in accordance with the first heavily doped region 210).

The doping concentration index of the first lightly doped region 220 may also be greater than 1 and less than or equal to 100, as long as it is much lower than the doping concentration index of the first heavily doped region 210.

In an embodiment, the doping concentration index of the first heavily doped region 210 is $a\times10^m$, the doping concentration index of the first lightly doped region 220 is $b\times10^n$, and m and n are both positive integers less than or equal to 7, and it is satisfied that $m-n\geq5$, $1\leq a\leq10$, and $1\leq b\leq10$.

In this way, the doping concentration index of the first heavily doped region 210 is at least five orders of magnitude greater than the doping concentration index of the first lightly doped region 220, thereby better improving the short-circuit current and open-circuit voltage of the solar cell 10 while better improving the photoelectric conversion efficiency of the solar cell 10.

In some embodiments, the doping concentration index of the second heavily doped region 310 is in a range from 10 to $1\times10^7$, and the doping concentration index of the second lightly doped region 320 is in a range from 1 to 100.

Exemplarily, the doping concentration index of the second heavily doped region 310 is 10, $1\times10^2$, $1\times10^3$, $1\times10^4$, $1\times10^5$, $1\times10^6$, or $1\times10^7$.

The doping concentration index of the second lightly doped region 320 may be 1, that is, the average doping concentration of the second lightly doped region 320 within the preset depth range is equal to the doping concentration of the substrate 100, or even the doping concentration of the second lightly doped region 320 is equal to the doping concentration of the substrate 100.

The doping concentration index of the second lightly doped region 320 may also be greater than 1 and less than or equal to 100, as long as it is much lower than the doping concentration index of the second heavily doped region 310.

In an embodiment, the doping concentration index of the second heavily doped region 310 is $c\times10^m$, the doping concentration index of the second lightly doped region 320 is $d\times10^n$, and it is satisfied that $1\leq c\leq10$, and $1\leq d\leq10$.

In this way, the doping concentration index of the second heavily doped region 310 is at least five orders of magnitude greater than the doping concentration index of the second lightly doped region 320, thereby better improving the short-circuit current and open-circuit voltage of the solar cell 10 while better improving the photoelectric conversion efficiency of the solar cell 10.

In some embodiments, the preset depth is in a range from 90 nm to 110 nm.

Optionally, the preset depth is 90 nm, 100 nm, or 110 nm.

Generally, the doping depth of the first heavily doped region 210 may be as deep as 5 micrometers to 6 micrometers, and the doping depth of the second heavily doped region 310 may be as deep as 5 micrometers to 6 micrometers. Therefore, setting the preset depth within an appropriate range can more accurately reflect the electrical properties of the first heavily doped region 210, the first lightly doped region 220, the second heavily doped region 310, and the second lightly doped region 320, thereby better improving the short-circuit current and open-circuit voltage of the solar cell 10 while better improving the photoelectric conversion efficiency of the solar cell 10.

The doping concentration index of the first heavily doped region 210 may be greater than, less than, or equal to the doping concentration index of the second heavily doped region 310, and the doping concentration index of the first lightly doped region 220 may be greater than, less than, or equal to the doping concentration index of the second lightly doped region 320, which is not limited specifically herein.

In some embodiments, the first heavily doped region 210 includes a first heavily doped sub-region 211, and second heavily doped sub-regions 212 located at opposite sides of the first heavily doped sub-region 211 respectively along a first object direction. The doping concentration index of the first heavily doped sub-region 211 is greater than the doping concentration index of each second heavily doped sub-region 212. The first object direction, an extension direction of the first heavily doped region 210, and the thickness direction Z of the substrate 100 are perpendicular to each other.

The first object direction may be a first direction F1 or a second direction F2. The drawings of the present invention show embodiments in which the first object direction is the first direction F1 and the extension direction of the first heavily doped region 210 is the second direction F2.

The first electrode 400 may include only the grid finger, or may include the grid finger and the main busbar. Compared with the grid finger, the main busbar mainly functions to collect current. In an embodiment, the first heavily doped region 210 is divided into the first heavily doped sub-region 211 with a relatively high doping concentration index and the second heavily doped sub-regions 212 each with a relatively low doping concentration index, so that the grid finger is subsequently arranged on the first heavily doped sub-region 211 with the relatively high doping concentration index, and so that the second heavily doped sub-regions 212, which are not corresponding to the grid finger, are configured to have the relatively low doping concentration index, thereby better improving the short-circuit current, open-circuit voltage and passivation performance of the solar cell 10 without affecting current collection.

In some embodiments, the first electrode 400 includes only the first sub-electrode 410, and the first sub-electrode 410 is a grid finger. Alternatively, the first electrode 400 includes the first sub-electrode 410 and a second sub-electrode cross-connected to the first sub-electrode 410, and the first sub-electrode 410 is the grid finger, and the second sub-electrode is the main busbar.

In the above two situations, the first sub-electrode 410 is disposed on the first heavily doped sub-region 211, and the extension direction of the first sub-electrode 410 is the same as the extension direction of the first heavily doped sub-region 211.

The first sub-electrode 410 is electrically connected to the first heavily doped sub-region 211.

An orthographic projection of the first sub-electrode 410 on the substrate 100 exactly overlaps with an orthographic projection of the first heavily doped sub-region 211 on the substrate 100, and does not overlap with orthographic projections of the second heavily doped sub-regions 212 on the substrate 100. The first heavily doped sub-region 211 and the first heavily doped region 210 are both symmetrically arranged with respect to a first reference plane, and the first reference plane passes through the center of the substrate 100 and is perpendicular to the first object direction.

Optionally, W1 denotes a dimension of the first heavily doped region 210 along the first object direction, W2 denotes a dimension of the first sub-electrode 410 along the first object direction, the units of W1 and W2 are the same, and it is satisfied that $W2=E1\times W1$, and $20\%\leq E1\leq 40\%$. In this way, the first sub-electrode 410 can occupy the middle position of the corresponding first heavily doped region 210 and occupy 20% to 40% of the first heavily doped region 210, which is conducive to more reliable electrical connection between the first sub-electrode 410 and the corresponding first heavily doped region 210.

Taking the first surface 101 provided with a main busbar as an example, compared with the first sub-electrode 410 serving as a grid finger, the main busbar mainly functions to collect current, and the first heavily doped sub-region 211 corresponding to the first sub-electrode 410 is configured to have a relatively high doping concentration index, while the second heavily doped sub-regions 212, which are not corresponding to the first sub-electrode 410, are configured to have a relative low doping concentration index, thereby improving the short-circuit current, open-circuit voltage and passivation performance of the solar cell 10 without affecting current collection.

Taking the first surface 101 not provided with a main busbar as an example, each of the second heavily doped sub-regions 212 is configured to have a relatively low doping concentration index, and the first heavily doped sub-region 211 corresponding to the first sub-electrode 410 is configured to have a relatively high doping concentration index, thereby better improving the short-circuit current, open-circuit voltage and passivation performance of the solar cell 10 without affecting current collection.

Specifically, in the embodiment that the first sub-electrode 410 is the grid finger and the second sub-electrode is the main busbar, the second sub-electrode is configured to extend along the first object direction, and the orthographic projection of the second sub-electrode on the substrate 100 exactly overlaps with the orthographic projections of the first heavily doped region 210 and first lightly doped region 220 on the substrate 100, respectively.

In this way, the current collection efficiency can be improved, thereby improving the photoelectric conversion efficiency of the solar cell 10.

In some embodiments, the second electrode 500 further includes a fourth sub-electrode cross-connected to the third sub-electrode 510.

In some embodiments, the second heavily doped region 310 includes a third heavily doped sub-region 311, and fourth heavily doped sub-regions 312 located at opposite sides of the third heavily doped sub-region 311 respectively along a second object direction. The doping concentration index of the third heavily doped sub-region 311 is greater than the doping concentration index of each fourth heavily doped sub-region 312. The second object direction, an extension direction of the second heavily doped region 310, and the thickness direction Z of the substrate 100 are perpendicular to each other.

The second object direction may be the first direction F1 or the second direction F2. The drawings of the present invention show embodiments in which the second object direction is the first direction F1 and the extension direction of the second heavily doped region 310 is the second direction F2.

The second electrode 500 may include only a grid finger, or may include a grid finger and a main busbar. Compared with the grid finger, the main busbar mainly functions to collect current. In an embodiment, the second heavily doped region 310 is divided into the third heavily doped sub-region 311 with a relatively high doping concentration index and the fourth heavily doped sub-regions 312 each with a relatively low doping concentration index, so that the grid finger is subsequently arranged in the third heavily doped sub-region 311 with the relatively high doping concentration index, and so that the fourth heavily doped sub-regions 312, which are not corresponding to the grid finger, are configured to have the relatively low doping concentration index, thereby better improving the short-circuit current, open-circuit voltage and passivation performance of the solar cell 10 without affecting current collection.

In some embodiments, the second electrode 500 includes only the third sub-electrode 510, and the third sub-electrode 510 is a grid finger. Alternatively, the second electrode 500 includes the third sub-electrode 510 and a fourth sub-electrode cross-connected to the third sub-electrode 510, and the third sub-electrode 510 is a grid finger, and the fourth sub-electrode is a main busbar.

In the above two situations, the third sub-electrode 510 is disposed on the third heavily doped sub-region 311, and the extension direction of the third sub-electrode 510 is the same as the extension direction of the third heavily doped sub-region 311.

The third sub-electrode 510 is electrically connected to the third heavily doped sub-region 311.

An orthographic projection of the third sub-electrode 510 on the substrate 100 exactly overlaps with an orthographic projection of the third heavily doped sub-region 311 on the substrate 100, and does not overlap with orthographic projections of the fourth heavily doped sub-regions 312 on the substrate 100. The third heavily doped sub-region 311 and the second heavily doped region 310 are both symmetrically arranged with respect to a second reference plane, and the second reference plane passes through the center of the substrate 100 and is perpendicular to the second object direction.

Optionally, W3 denotes a dimension of the second heavily doped region 310 along the second object direction, W4 denotes a dimension of the third sub-electrode 510 along the second object direction, and the units of W3 and W4 are the same, and it is satisfied that $W4=E2\times W3$, and $20\%\leq E2\leq 40\%$. In this way, the third sub-electrode 510 can occupy the middle position of the corresponding second heavily doped region 310 and occupy 20% to 40% of the second heavily doped region 310, which is conducive to more reliable electrical connection between the third sub-electrode 510 and the corresponding second heavily doped region 310.

Similarly, the fourth heavily doped sub-regions 312, which are not corresponding to the third sub-electrode 510, are configured to have a relatively low doping concentration index, and the third heavily doped sub-region 311, which is corresponding to the third sub-electrode 510, is configured to have a relatively high doping concentration index, thereby better improving the short-circuit current, open-circuit voltage and passivation performance of the solar cell 10 without affecting current collection.

Specifically, in the embodiment that the third sub-electrode 510 is the grid finger and the fourth sub-electrode is the main busbar, the fourth sub-electrode is configured to extend along the second object direction, and the orthographic projection of the fourth sub-electrode on the substrate 100 exactly overlaps with the orthographic projections of the second heavily doped region 310 and second lightly doped regions 320 on the substrate 100, respectively.

In this way, the current collection efficiency can be improved, thereby improving the photoelectric conversion efficiency of the solar cell 10.

In some embodiments, the doping concentration index of the first heavily doped sub-region 211 is in a range from 10 to $1\times10^{7}$, and the doping concentration index of the second heavily doped sub-region 212 is in a range from 5 to $5\times10^{6}$.

For example, the doping concentration index of the first heavily doped sub-region 211 is 10, $1\times10^{2}$, $1\times10^{3}$, $1\times10^{4}$, $1\times10^{5}$, $1\times10^{6}$, or $1\times10^{7}$, and the doping concentration index of each second heavily doped sub-region 212 is 5, 50, $5\times10^{2}$, $5\times10^{3}$, $5\times10^{4}$, $5\times10^{5}$, or $5\times10^{6}$ correspondingly.

The doping concentration index of the third heavily doped sub-region 311 is in a range from 10 to $1\times10^{7}$, and the doping concentration index of each fourth heavily doped sub-region 312 is in a range from 5 to $5\times10^{6}$.

For example, the doping concentration index of the third heavily doped sub-region 311 is 10, $1\times10^{2}$, $1\times10^{3}$, $1\times10^{4}$, $1\times10^{5}$, $1\times10^{6}$, or $1\times10^{7}$, and the doping concentration index of each fourth heavily doped sub-region 312 is 5, 50, $5\times10^{2}$, $5\times10^{3}$, $5\times10^{4}$, $5\times10^{5}$, or $5\times10^{6}$ correspondingly.

In this way, the doping concentration index of the second heavily doped sub-region 212 is slightly lower than the doping concentration index of the first heavily doped sub-region 211, and the doping concentration index of the fourth heavily doped sub-region 312 is slightly lower than the third heavily doped sub-region 311, thereby better improving the short-circuit current, open-circuit voltage and passivation performance of the solar cell 10 while better meeting the requirement of the current collection.

Figure 3:
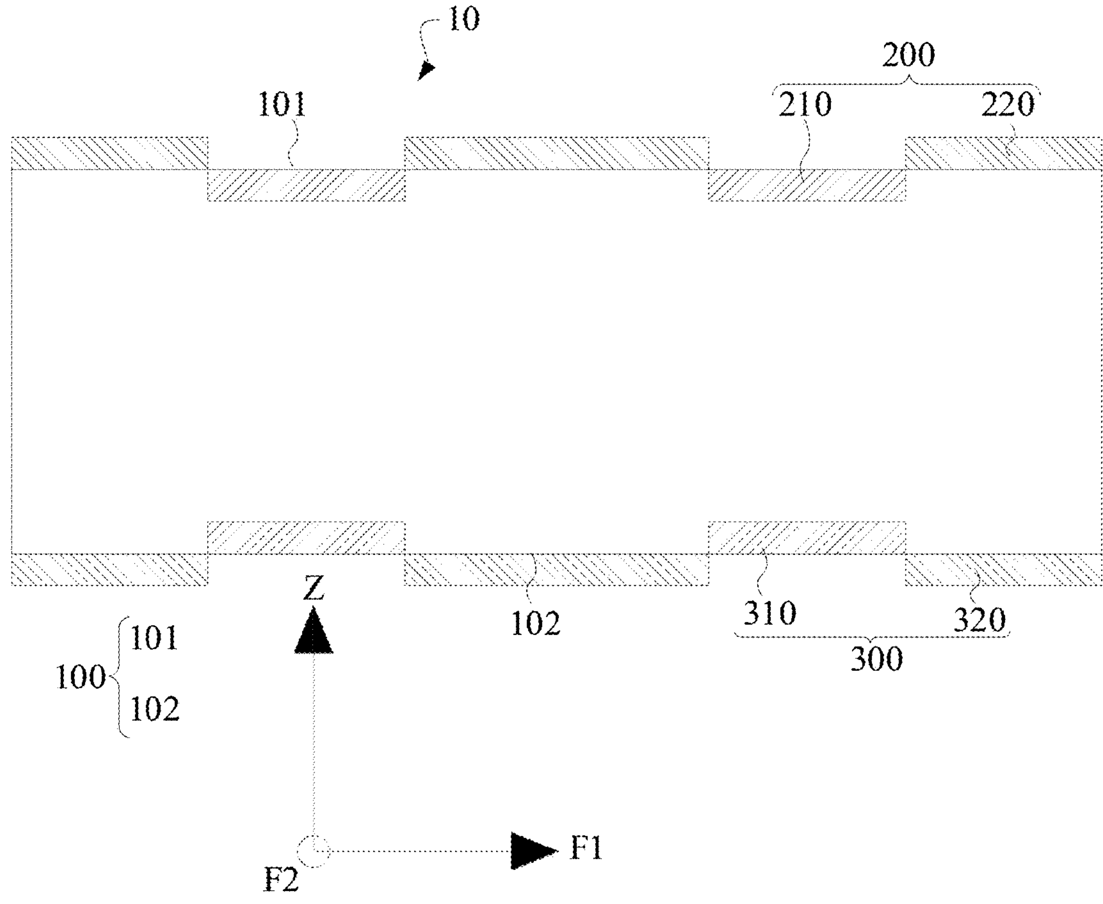
FIG. 3 is a schematic view showing partial structure of the solar cell according to yet another embodiment of the present application.
Figure 4:
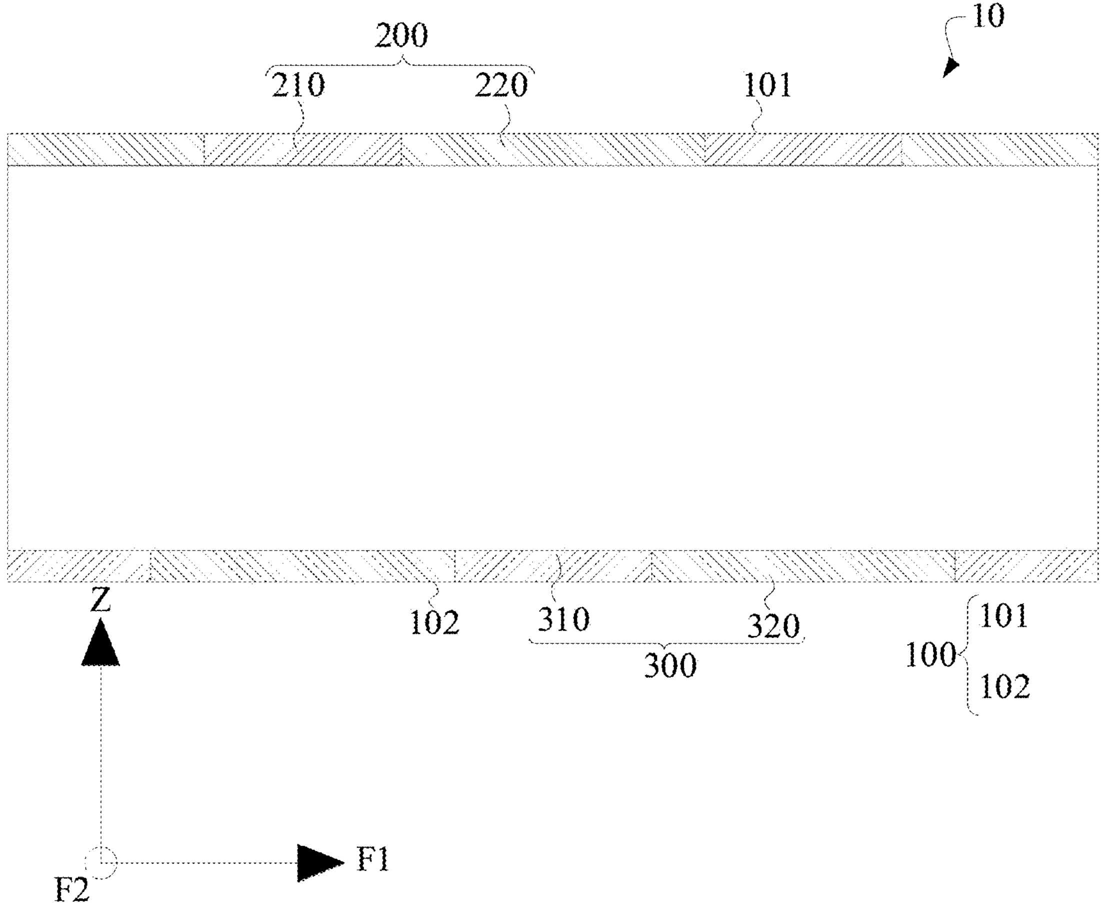
FIG. 4 is a schematic view showing partial structure of the solar cell according to yet another embodiment of the present application.

In an embodiment, as shown in FIG. 3, the first heavily doped region 210 is closer to the second surface 102 than the first lightly doped region 220 along the thickness direction Z of the substrate 100.

According to an embodiment of the present invention, firstly, a first lightly-doped-material layer is formed on the first surface 101, and then a first mask layer is formed on the first lightly-doped-material layer, and then portions of the first lightly-doped-material layer, which are not covered by the first mask layer, are removed (the portions of the first lightly-doped-material layer, which are not covered by the first mask layer, may be removed by wet etching or dry etching), so as to obtain a plurality of first lightly doped regions 220 formed on the first surface 101. Subsequently, a first doping source is formed on the first surface 101, and a portion of the first doping source covers the first mask layer, and then the first mask layer is removed, correspondingly, the portion of the first doping source covering the first mask layer is also removed. Finally, the first dopant elements in the first doping source are diffused into the substrate 100 by high-temperature diffusion or the like, so as to obtain a plurality of first heavily doped regions 210. Compared with the first lightly doped region 220, the first heavily doped region 210 is closer to the second surface 102 along the thickness direction Z of the substrate 100.

Figure 2:
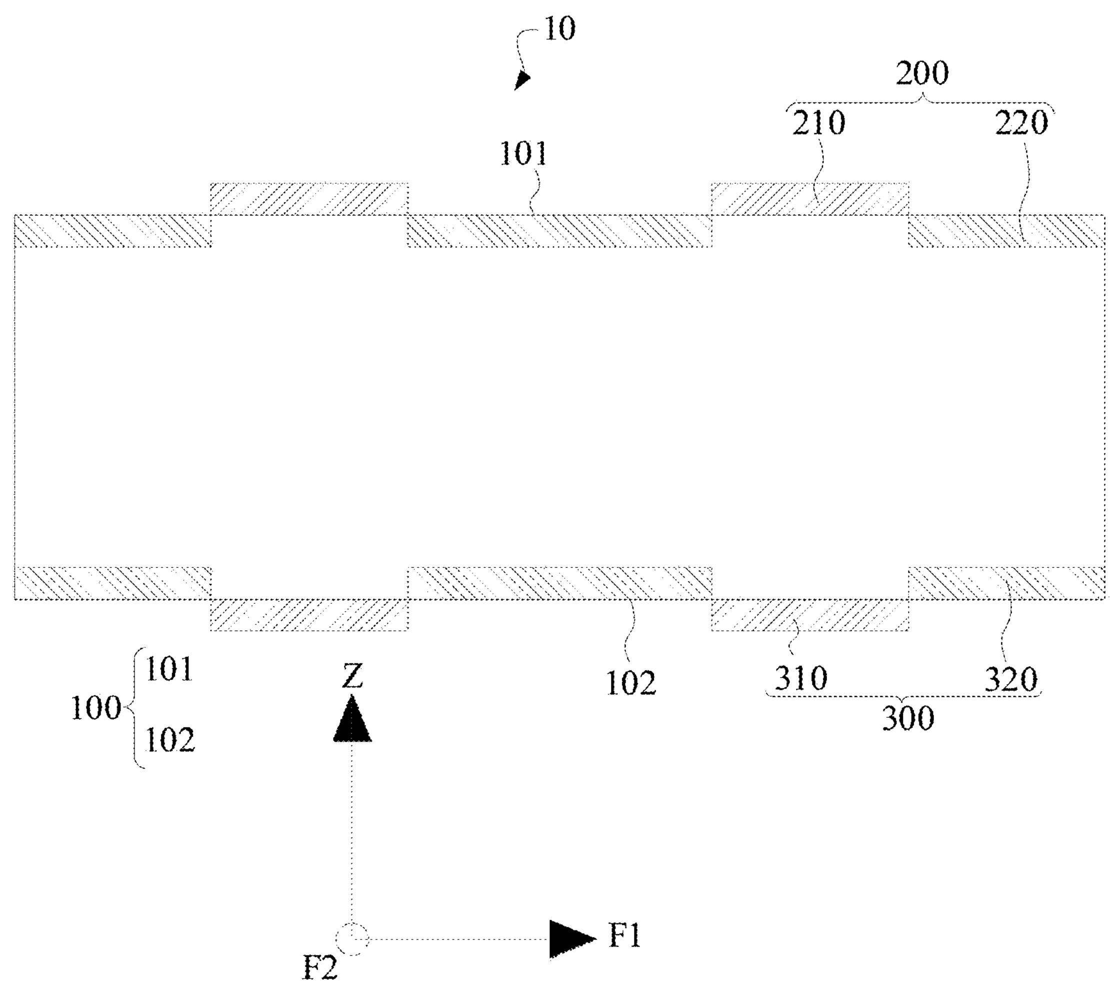
FIG. 2 is a schematic view showing partial structure of the solar cell according to another embodiment of the present application.

In an embodiment, as shown in FIG. 2, the first heavily doped region 210 is farther away from the second surface 102 than the first lightly doped region 220 along the thickness direction Z of the substrate 100.

According to an embodiment of the invention, firstly, a first heavily-doped material layer is formed on the first surface 101, and then a second mask layer is formed on the first heavily-doped material layer, and then portions of the first heavily-doped material layer, which are not covered by the second mask layer, are removed (the portions of the first heavily-doped material layer, which are not covered by the second mask layer, may be removed by wet etching or dry etching), so as to obtain a plurality of first heavily doped regions 210 formed on the first surface 101. Subsequently, a second doping source is formed on the first surface 101, and a portion of the second doping source covers the second mask layer, and then the second mask layer is removed, correspondingly, the portion of the second doping source covering the second mask layer is also removed. Finally, the second dopant elements in the second doping source are diffused into the substrate 100 by high-temperature diffusion or the like, so as to obtain a plurality of first lightly doped regions 220. Compared with the first lightly doped region 220, the first heavily doped region 210 is farther away from the second surface 102 along the thickness direction Z of the substrate 100.

Exemplarily, in an embodiment, the conductivity type of the substrate 100 is N-type, and the conductivity type of the first dopant element is P-type.

In an embodiment, as shown in FIG. 1 or any one of FIGS. 4 to 7, a side of the first heavily doped region 210 away from the second surface 102 is flush with a side of the first lightly doped region 220 away from the second surface 102 along the thickness direction Z of the substrate 100.

A region in the substrate 100 corresponding to the first heavily doped region 210 may be directionally doped by laser doping to obtain a plurality of first heavily doped regions 210. At the same time, the undoped regions on the substrate 100 are a plurality of first lightly doped regions 220. In this case, the doping concentration index of the first lightly doped region 220 is 1. The present application is not limited thereto, and a plurality of first heavily doped regions 210 and a plurality of first lightly doped regions 220 may also be formed by other manners, and along the thickness direction Z of the substrate 100, the side of the first heavily doped region 210 away from the second surface 102 is flush with the side of the first lightly doped region 220 away from the second surface 102.

One of the above three manners may be selected according to the process requirements and the performance requirements of the solar cell 10.

Similarly, one of the following three manners may be selected according to the process requirements and the performance requirements of the solar cell 10. For the first manner, as shown in FIG. 3, along the thickness direction Z of the substrate 100, the second heavily doped region 310 is closer to the first surface 101 than the second lightly doped region 320. For the second manner, as shown in FIG. 2, along the thickness direction Z of the substrate 100, the second heavily doped region 310 is farther away from the first surface 101 than the second lightly doped region 320. For the third manner, as shown in FIG. 1 or any one of FIGS. 4 to 7, along the thickness direction Z of the substrate 100, the side of the second heavily doped region 310 away from the first surface 101 is flush with the side of the second lightly doped region 320 away from the first surface 101.

In some embodiments, as shown in FIG. 2 or FIG. 3, along the thickness direction Z of the substrate 100, a distance between a side of the first heavily doped region 210 away from the second surface 102 and a side of the first lightly doped region 220 away from the second surface 102 is a first distance, and the first distance is in a range from 1 μm to 10 μm.

In an embodiment, along the thickness direction Z of the substrate 100, the first heavily doped region 210 is closer to the second surface 102 than the first lightly doped region 220 (as shown in FIG. 3). Alternatively, along the thickness direction Z of the substrate 100, the first heavily doped region 210 is farther away from the second surface 102 than the first lightly doped region 220 (as shown in FIG. 2).

Exemplarily, the first distance is 1 μm, 2 μm, 3 μm, 4 μm, 5 μm, 6 μm, 7 μm, 8 μm, 9 μm or 10 μm.

The first distance is configured within a suitable range, such as in a range from 1 μm to 10 μm, so as to meet the process requirements and improve the manufacturing convenience of the solar cell 10.

In some embodiments, as shown in FIG. 2 or FIG. 3, along the thickness direction Z of the substrate 100, a distance between a side of the second heavily doped region 310 away from the first surface 101 and a side of the second lightly doped region 320 away from the first surface 101 is a second distance, and the second distance is in a range from 1 μm to 10 μm.

In an embodiment, along the thickness direction Z of the substrate 100, the second heavily doped region 310 is closer to the first surface 101 than the second lightly doped region 320 (as shown in FIG. 3). Alternatively, along the thickness direction Z of the substrate 100, the second heavily doped region 310 is farther away from the first surface 101 than the second lightly doped region 320 (as shown in FIG. 2).

The second distance is configured within a suitable range, such as in a range from 1 μm to 10 μm, so as to meet the process requirements and improve the manufacturing convenience of the solar cell 10.

In some embodiments, the first heavily doped region 210 and the first lightly doped region 220 are both configured to extend along one of the first direction F1 and the second direction F2, and the first heavily doped region 210 and the first lightly doped region 220 are alternately arranged along the other of the first direction F1 and the second direction F2. The first direction F1 and the second direction F2 intersect each other and are both perpendicular to the thickness direction Z of the substrate 100.

In an embodiment, the first heavily doped region 210 and the first lightly doped region 220 are both configured to extend along the first direction F1, and the first heavily doped region 210 and the first lightly doped region 220 are alternately arranged along the second direction F2. Alternatively, the first heavily doped region 210 and the first lightly doped region 220 are both configured to extend in the second direction F2, and the first heavily doped region 210 and the first lightly doped region 220 are alternately arranged along the first direction F1.

The second heavily doped region 310 and the second lightly doped region 320 are both configured to extend along one of the first direction F1 and the second direction F2, and the second heavily doped region 310 and the second lightly doped region 320 are alternately arranged along the other of the first direction F1 and the second direction F2. The first direction F1 and the second direction F2 intersect each other and are both perpendicular to the thickness direction Z of the substrate 100.

In an embodiment, the second heavily doped region 310 and the second lightly doped region 320 are both configured to extend along the first direction F1, and the second heavily doped region 310 and the second lightly doped region 320 are alternately arranged along the second direction F2. Alternatively, the second heavily doped region 310 and the second lightly doped region 320 are both configured to extend along the second direction F2, and the second heavily doped region 310 and the second lightly doped region 320 are alternately arranged along the first direction F1.

In an embodiment, the first direction F1 and the second direction F2 are perpendicular to each other and perpendicular to the thickness direction Z of the substrate 100. Specifically, the first direction F1 is parallel to one of a length direction of the substrate 100 and the width direction of the substrate 100, and the second direction F2 is parallel to the other of the length direction of the substrate 100 and the width direction of the substrate 100.

In this way, the first heavily doped region 210 and the first lightly doped region 220 are arranged regularly, and the second heavily doped region 310 and the second lightly doped region 320 are arranged regularly, which is beneficial to improving the manufacturing convenience of the solar cell 10 and facilitating the reasonable use of the first surface 101 or the second surface 102, thereby better improving the short-circuit current and open-circuit voltage of the solar cell 10 while better improving the photoelectric conversion efficiency of the solar cell 10.

In some embodiments, the first heavily doped region 210, the first lightly doped region 220, the second heavily doped region 310, and the second lightly doped region 320 are all configured to extend along the first direction F1. The first heavily doped region 210 and the first lightly doped region 220 are alternately arranged along the second direction F2, and the second heavily doped region 310 and the second lightly doped region 320 are alternately arranged along the second direction F2. The first heavily doped region 210 and the second heavily doped region 310 are arranged in a staggered pattern along the second direction F2, and the first lightly doped region 220 and the second lightly doped region 320 are arranged in a staggered pattern along the second direction F2.

In some other embodiments, the first heavily doped region 210, the first lightly doped region 220, the second heavily doped region 310, and the second lightly doped region 320 are all configured to extend along the second direction F2, the first heavily doped region 210 and the first lightly doped region 220 are alternately arranged along the first direction F1, and the second heavily doped region 310 and the second lightly doped region 320 are alternately arranged along the first direction F1. The first heavily doped region 210 and the second heavily doped region 310 are arranged in a staggered pattern along the first direction F1, and the first lightly doped region 220 and the second lightly doped region 320 are arranged in a staggered pattern along the first direction F1.

In this way, a problem of poor luminescence caused by the alignment of the first heavily doped region 210 and the second heavily doped region 310 can be solved, thereby improving the quality of the solar cell 10. Additionally, it is beneficial to locate at least one of the first heavily doped region 210 and the second heavily doped region 310 at the central region of the substrate 100, thereby shortening an average transmission path of the carriers at the central region of the substrate 100, and improving the electrical performance of the solar cell 10.

In some embodiments, the first heavily doped region 210 includes the first heavily doped sub-region 211, and the second heavily doped sub-regions 212 located at opposite sides of the first heavily doped sub-region 211 respectively along the first object direction. The second heavily doped region 310 includes the third heavily doped sub-region 311, and the fourth heavily doped sub-regions 312 located at opposite sides of the third heavily doped sub-region 311 respectively along the second object direction. The orthographic projection of the first heavily doped sub-region 211 on the substrate 100 does not overlap with the orthographic projection of the third heavily doped sub-region 311 on the substrate 100. The first object direction, the extension direction of the first heavily doped region 210, and the thickness direction Z of the substrate 100 are perpendicular to each other. The second object direction, the extension direction of the second heavily doped region 310, and the thickness direction Z of the substrate 100 are perpendicular to each other.

In this way, the first heavily doped sub-region 211 of the first heavily doped region 210 and the third heavily doped sub-region 311 of the second heavily doped region 310 are arranged in a fully staggered pattern without alignment, that is, the central region of the first heavily doped region 210 and the central region of the second heavily doped region 310 are arranged in a fully staggered pattern without alignment, thereby better improving the quality of the solar cell 10 and also better improving the electrical performance of the solar cell 10.

In some embodiments, the first lightly doped region 220 includes a first lightly doped sub-region (not shown in the figures), and second lightly doped sub-regions (not shown in the figures) located at two opposite sides of the first lightly doped sub-region respectively along the first object direction. The second lightly doped region 320 includes a third lightly doped sub-region (not shown in the figures), and fourth lightly doped sub-regions (not shown in the figures) located at two opposite sides of the third lightly doped sub-region respectively along the second object direction. The orthographic projection of the first lightly doped sub-region on the substrate 100 does not overlap with the orthographic projection of the third lightly doped sub-region on the substrate 100.

In this way, the first lightly doped sub-region of the first lightly doped region 220 and the third lightly doped sub-region of the third lightly doped region 320 are arranged in a fully staggered pattern without alignment, that is, the central region of the first lightly doped region 220 and the central region of the second lightly doped region 320 are arranged in a fully staggered pattern without alignment, thereby better improving the quality of the solar cell 10 and better improving the electrical performance of the solar cell 10 as well.

Figure 5:
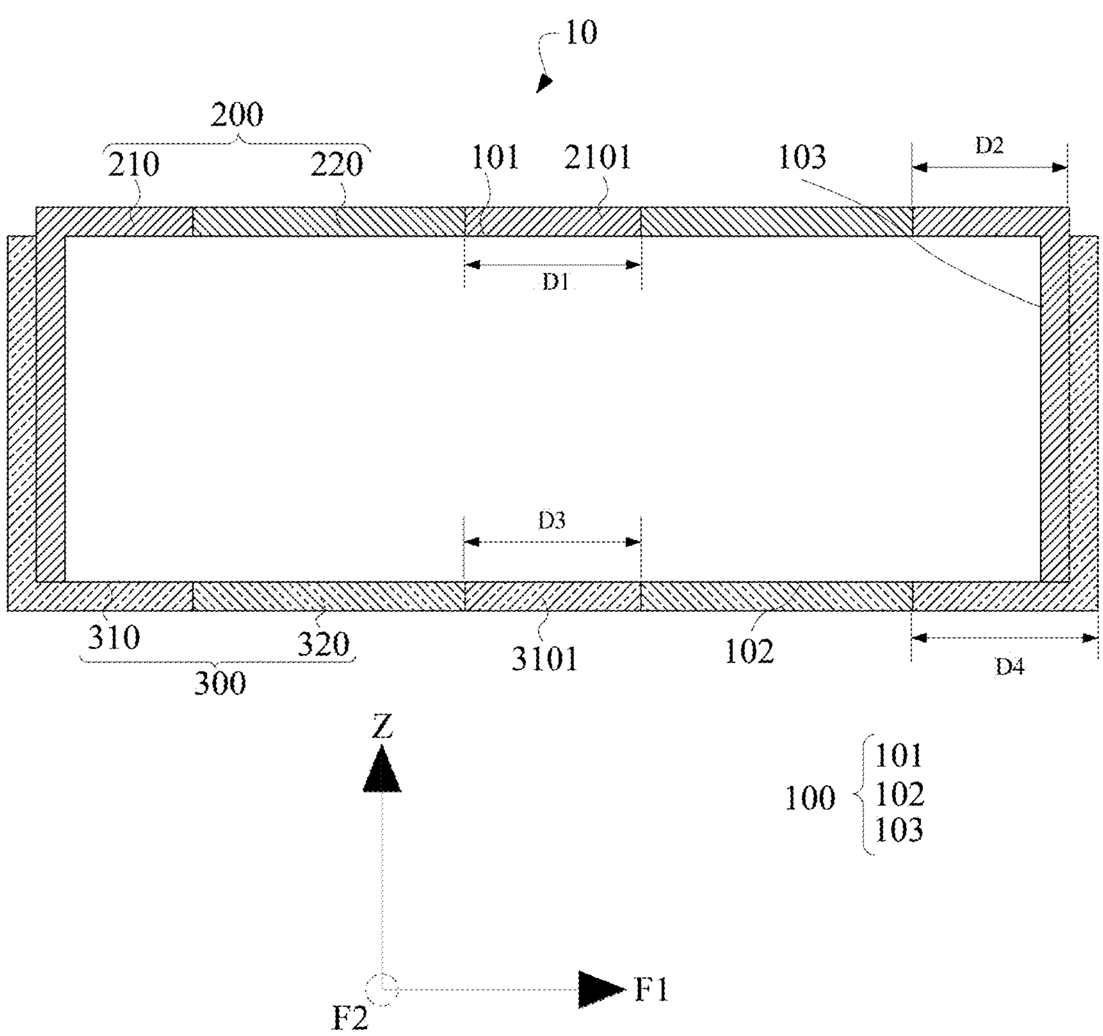
FIG. 5 is a schematic view showing partial structure of the solar cell according to yet another embodiment of the present application.

In some embodiments, as shown in FIG. 5, the substrate 100 further has side surfaces 103 each connected between the first surface 101 and the second surface 102, and at least one of the first heavily doped region 210 and the second heavily doped region 310 is configured to extend to each side surface 103 and connected to the corresponding side surface 103.

A shaded area of the solar cell 10 is prone to heat up. Therefore, at least one of the first heavily doped region 210 and the second heavily doped region 310 is configured to extend to each side surface 103 and connected to the corresponding side surface 103, which is beneficial to form a leakage design allowing for carriers to pass through at the joint of the first heavily doped region 210 and the second heavily doped region 310, thereby beneficially ameliorating a hot spot effect of the solar cell 10 and further increasing the service life of the solar cell 10.

In some embodiments, the first heavily doped region 210 is configured to extend to each side surface 103, and a portion of the first heavily doped region 210 extending to a corresponding side surface 103 is adapted to extend from a side proximate to the first surface 101 to a side proximate to the second surface 102.

Thus, the first heavily doped region 210 is configured to extend from the side proximate to the first surface 101 to the side proximate to the second surface 102, which is beneficial to increase the contact area between the first heavily doped region 210 and the second heavily doped region 310, thereby beneficially ameliorating the hot spot effect of the solar cell 10 and further increasing the service life of the solar cell 10.

In some embodiments, as shown in FIG. 5, the second heavily doped region 310 is configured to extend to each side surface 103, and a portion of the second heavily doped region 310 extending to a corresponding side surface 103 is adapted to extend from a side proximate to the second surface 102 to a side proximate to the first surface 101.

In this way, the second heavily doped region 310 is extended from the side proximate to the second surface 102 to the side proximate to the first surface 101, which is beneficial to increase the contact area between the first heavily doped region 210 and the second heavily doped region 310, thereby beneficially ameliorating the hot spot effect of the solar cell 10 and further increasing the service life of the solar cell 10.

In some embodiments, the portion of the first heavily doped region 210 extending to a corresponding side surface 103 is arranged to surround the corresponding side surface 103.

In some embodiments, the portion of second heavily doped region 310 extending to a corresponding side surface 103 is arranged to surround the corresponding side surface 103.

In this way, the contact area between the first heavily doped region 210 and the second heavily doped region 310 can be increased, thereby beneficially ameliorating the hot spot effect of the solar cell 10 and further increasing the service life of the solar cell 10.

In some embodiments, the first heavily doped regions 210 and the first lightly doped regions 220 are alternately arranged along the first object direction. The first object direction, the extension direction of the first heavily doped regions 210, and the thickness direction Z of the substrate 100 are perpendicular to each other. Among all the first heavily doped regions 210, there is a first central heavily doped region 2101. D1 denotes a dimension of the first central heavily doped region 2101 along the first object direction, and D2 denotes a dimension of each of the remaining first heavily doped regions 210 among all first heavily doped regions 210 except the first central heavily doped region 2101 along the first object direction, and it is satisfied that D1>D2. The second heavily doped regions 310 and the second lightly doped regions 320 are alternately arranged along the second object direction, and the second object direction, the extension direction of the second heavily doped region 310, and the thickness direction Z of the substrate 100 are perpendicular to each other. Among all second heavily doped regions 310, there is a second central heavily doped region 3101. D3 denotes a dimension of the second central heavily doped region 3101 along the second object direction, and D4 denotes a dimension of each of the remaining second heavily doped regions 310 among all second heavily doped regions 310 except the second central heavily doped region 3101 along the second object direction, and it is satisfied that D3>D4.

Exemplarily, D1>2×D2, and D3>2×D4.

Optionally, the emitter structure 200 includes a plurality of first heavily doped regions 210 and a plurality of first lightly doped regions 220. Each first lightly doped region 220 is located between two adjacent first heavily doped regions 210. The first central heavily doped region 2101 and the substrate 100 are symmetrically arranged with respect to the first object plane respectively, and the first object plane passes through the central of the substrate 100 and is perpendicular to the first object direction.

Optionally, the doped conductive structure 300 includes a plurality of second heavily doped regions 310 and a plurality of second lightly doped regions 320. Each second lightly doped region 320 is located between two adjacent second heavily doped regions 310. The second central heavily doped region 3101 and the substrate 100 are symmetrically arranged with respect to the second object plane respectively, and the second object plane passes through the central of the substrate 100 and is perpendicular to the second object direction.

In this way, the solar cell 10 is evenly divided into two cell halves at a central symmetry plane of the first central heavily doped region 2101 (the central symmetry plane of the first central heavily doped region 2101 is perpendicular to the first object direction, passes through the center of the substrate 100, and coincides with the first object plane), and at a central symmetry plane of the second central heavily doped region 3101 (the central symmetry plane of the second central heavily doped region 3101 is perpendicular to the second object direction, passes through the center of the substrate 100, and coincides with the second object plane).

In this embodiment, the central symmetry plane of the first central heavily doped region 2101 and the central symmetry plane of the second central heavily doped region 3101 coincide with each other, and the first object plane and the second object plane coincide with each other.

In some embodiments, S1 denotes a sum of the orthographic projection areas of all first heavily doped regions 210 on the substrate 100, and S2 denotes a sum of the orthographic projection areas of all first lightly doped regions 220 on the substrate 100, where S1 and S2 have the same unit, and S1 and S2 satisfy: S1/S2=a1, and a1 is in a range from 10% to 50%.

Exemplarily, a1 may be 10%, 20%, 30%, 40%, or 50%.

A dimension of the first heavily doped region 210 along the first object direction is in a range from 50 μm to 300 μm, and a dimension of the first lightly doped region 220 along the first object direction is in a range from 500 μm to 1000 μm. That is, a width of the first heavily doped region 210 is in a range from 50 μm to 300 μm, and a width of the first slightly doped region 220 is in a range from 500 μm to 1000 μm. Exemplarily, the width of the first heavily doped region 210 is 50 μm, 100 μm, 200 μm, or 300 μm, and the width of the first slightly doped region 220 is 500 μm, 600 μm, 700 μm, 800 μm, 900 μm, or 1000 μm.

S1/S2 is configured within a suitable range, such as in a range from 10% to 50%, which is conducive to reasonably arranging all first heavily doped regions 210 and all first lightly doped regions 220, thereby better improving the short-circuit current and open-circuit voltage of the solar cell 10 while better improving the photoelectric conversion efficiency of the solar cell 10.

In some embodiments, S3 denotes a sum of the orthographic projection areas of all second heavily doped regions 310 on the substrate 100, and S4 denotes a sum of the orthographic projection areas of all second lightly doped regions 320 on the substrate 100, where S3 and S4 have the same unit, and S3 and S4 satisfy that S3/S4=a2, and a2 is in a range from 10% to 50%.

Exemplarily, a2 may be 10%, 20%, 30%, 40%, or 50%.

Optionally, a dimension of the second heavily doped region 310 along the first object direction is in a range from 50 μm to 300 μm, and a dimension of the second lightly doped region 320 along the first object direction is in a range from 500 μm to 1000 μm. That is, a width of the second heavily doped region 310 is in a range from 50 μm to 300 μm, and a width of the second lightly doped region 320 is in a range from 500 μm to 1000 μm. Exemplarily, the width of the second heavily doped region 310 is 50 μm, 100 μm, 200 μm, or 300 μm, and the width of the second lightly doped region 320 is 500 μm, 600 μm, 700 μm, 800 μm, 900 μm, or 1000 μm.

S3/S4 is configured within a suitable range, such as in a range from 10% to 50%, which is conducive to reasonably distributing all second heavily doped regions 310 and all second lightly doped regions 320, thereby better improving the short-circuit current and open-circuit voltage of the solar cell 10 while better improving the photoelectric conversion efficiency of the solar cell 10.

Figure 6:
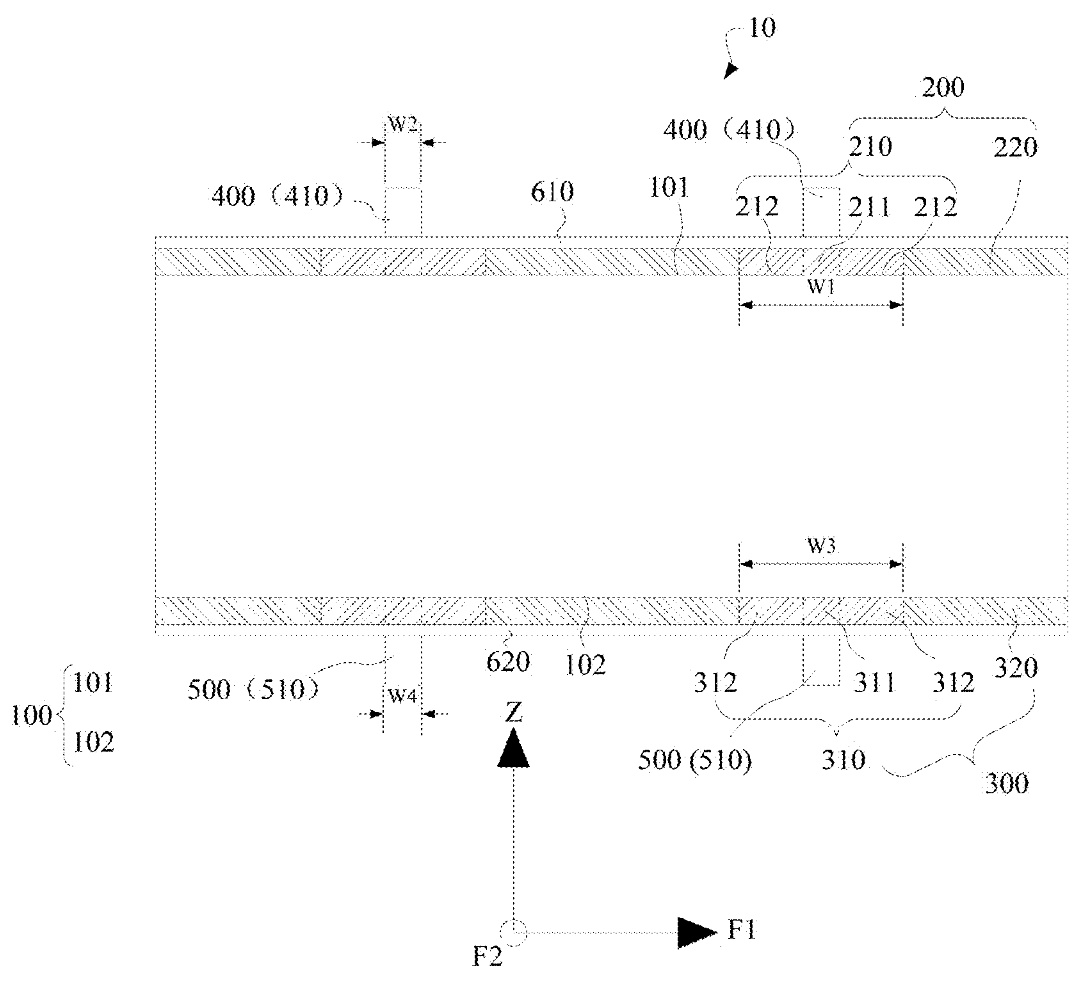
FIG. 6 is a schematic view showing structure of the solar cell according to an embodiment of the present application.

In some embodiments, as shown in FIG. 6, the solar cell 10 further includes a first passivation layer 610 and a second passivation layer 620. The first passivation layer 610 is disposed on a side of the emitter structure 200 away from the substrate 100, and the second passivation layer 620 is disposed on a side of the doped conductive structure 300 away from the substrate 100. The first electrode 400 is disposed on a side of the first passivation layer 610 away from the emitter structure 200, and the second electrode 500 is disposed on a side of the second passivation layer 620 away from the doped conductive structure 300. The material of the first passivation layer 610 is different from the material of the second passivation layer 620.

The conductivity types of the dopant element of the emitter structure 200 and the dopant element of the doped conductive structure 300 are opposite to each other. Therefore, the material of the first passivation layer 610 and the material of the second passivation layer 620 are configured to be different from each other so that a suitable material of the first passivation layer 610 may be selected according to the dopant element of the emitter structure 200, and a suitable material of the second passivation layer 620 may be selected according to the dopant element of the doped conductive structure 300. In this way, the passivation performance of the solar cell 10 can be better improved.

For example, the dopant element of the emitter structure 200 is boron, and the material of the first passivation layer 610 may be aluminum oxide ($AlO_x$); and the dopant element of the doped conductive structure 300 is phosphorus, and the material of the second passivation layer 620 may be silicon oxide ($SiO_x$) or phosphorus oxide ($P_xO_y$), etc. For another example, the dopant element of the emitter structure 200 is phosphorus, the material of the first passivation layer 610 may be silicon oxide ($SiO_x$) or phosphorus oxide ($P_xO_y$), etc.; and the dopant element of the doped conductive structure 300 is boron, and the material of the second passivation layer 620 may be aluminum oxide ($AlO_x$).

The present application is not limited thereto. In other embodiments, the first passivation layer 610 and the second passivation layer 620 are made of the same material. In this way, the first passivation layer 610 and the second passivation layer 620 may be formed in the same process, thereby improving the manufacturing efficiency of the solar cell 10.

Figure 7:
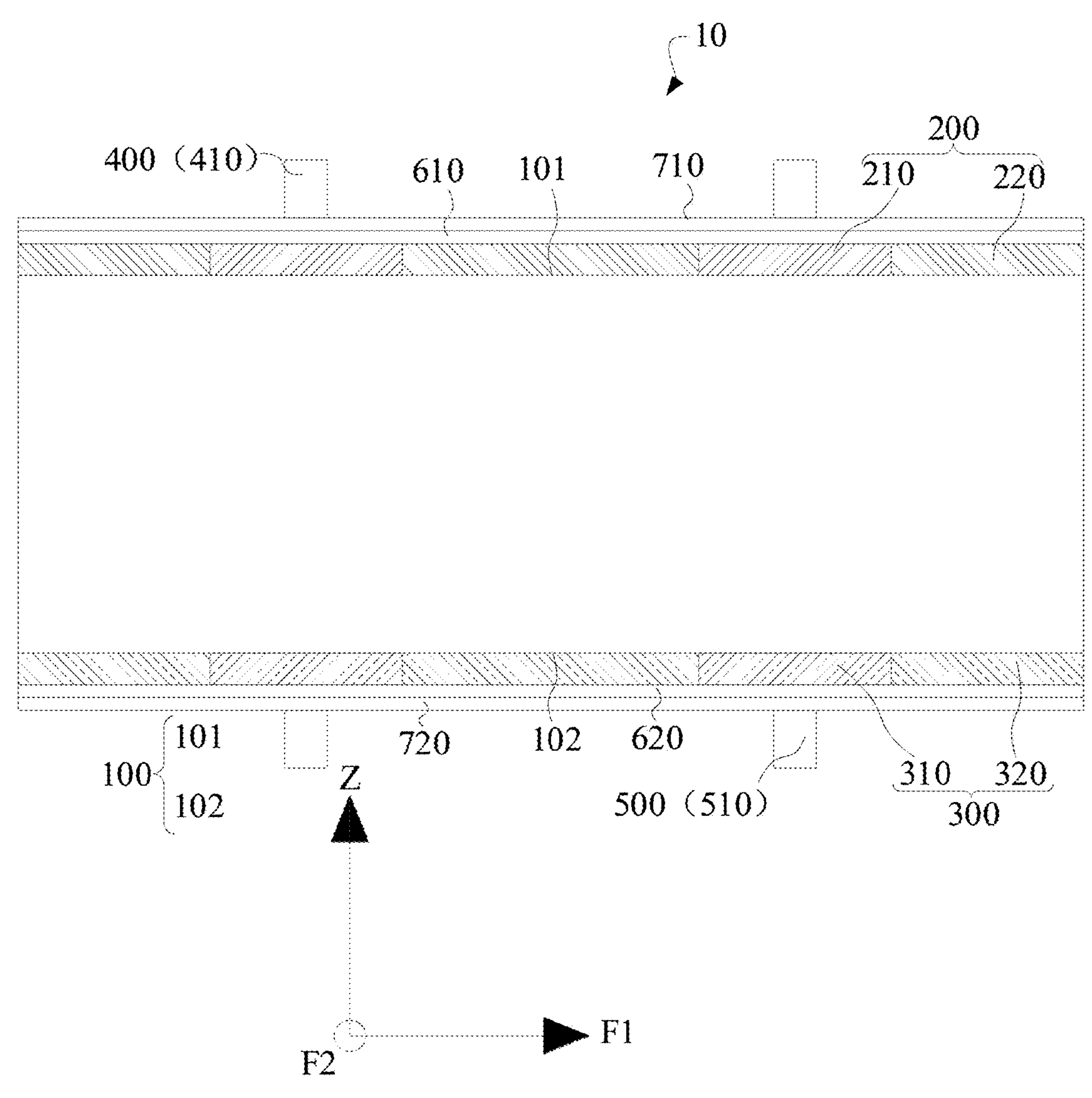
FIG. 7 is a schematic view showing structure of the solar cell according to another embodiment of the present application.

In some embodiments, as shown in FIG. 7, the solar cell 10 further includes a first anti-reflection layer 710 and a second anti-reflection layer 720. The first anti-reflection layer 710 is disposed on a side of the first passivation layer 610 away from the emitter structure 200, and the second anti-reflection layer 720 is disposed on a side of the second passivation layer 620 away from the doped conductive structure 300. The first electrode 400 is disposed on a side of the first anti-reflection layer 710 away from the first passivation layer 610, and the second electrode 500 is disposed on a side of the second anti-reflection layer 720 away from the second passivation layer 620.

Optionally, the materials of the first anti-reflection layer 710 and the second anti-reflection layer 720 may be the same or different.

Optionally, the materials of the first anti-reflection layer 710 and the second anti-reflection layer 720 are silicon nitride, silicon oxynitride or silicon oxide.

On one hand, the first anti-reflection layer 710 and the second anti-reflection layer 720 are configured to reduce the reflection of light and increase the amount of light absorbed by the solar cell. On the other hand, the first anti-reflection layer 710 and the second anti-reflection layer 720 also provide a passivation effect, thereby improving the efficiency of the solar cell 10.

In other embodiments, the solar cell 10, as a bifacial cell, may be applied in technology of tunneling oxide passivated contact (TOPCon) or passivated emitter and rear cell (PERC).

An embodiment of the present application provides a photovoltaic module, including the solar cell 10 of any one of the above embodiments.

The solar cell 10 may include two solar cell halves, and thus, the photovoltaic module may include the even number of solar cell halves.

The above-described embodiments may be arbitrarily combined. To make the description concise, not all possible combinations of the technical features in the above-described embodiments are described. However, as long as there is no contradiction in the combinations of these technical features, the combinations should be considered to be within the scope of this specification.

The embodiments above are only several implementation modes of the present application, and the description thereof is relatively specific and detailed, but should not be construed as limiting the scope of the patent. It should be noted that for those ordinary skilled in the art, various modifications and improvements may be made without departing from the concept of the present application, and all these modifications and improvements are within the protection scope of the present application. Therefore, the scope of protection of the patent application should be subject to the appended claims.

The invention claimed is:

1. A solar cell, comprising:

a substrate having a first surface and a second surface arranged opposite to each other along a thickness direction of the substrate;

an emitter structure, arranged on the first surface of the substrate, and comprising a first heavily doped region and a first lightly doped region arranged alternately;

a doped conductive structure, disposed on the second surface of the substrate, and comprising a second heavily doped region and a second lightly doped region alternately arranged; the second heavily doped region, the second lightly doped region and the substrate having the same conductivity type;

a first electrode disposed at least on the first heavily doped region of the emitter structure and electrically connected to the first heavily doped region; and a second electrode disposed at least on the second heavily doped region of the doped conductive structure and electrically connected to the second heavily doped region;

wherein a doping concentration index of the first heavily doped region is greater than a doping concentration index of the first lightly doped region; the doping concentration index of the first heavily doped region is a ratio of an average doping concentration of the first heavily doped region within a preset depth range to a doping concentration of the substrate, and the doping concentration index of the first lightly doped region is a ratio of an average doping concentration of the first lightly doped region within the preset depth range to the doping concentration of the substrate; and a doping concentration index of the second heavily doped region is greater than a doping concentration index of the second lightly doped region; the doping concentration index of the second heavily doped region is a ratio of an average doping concentration of the second heavily doped region within the preset depth range to the doping concentration of the substrate, and the doping concentration index of the second lightly doped region is a ratio of an average doping concentration of the second lightly doped region within the preset depth range to the doping concentration of the substrate;

wherein the doping concentration index of the first heavily doped region is in a range from 10 to $1\times10^7$, and the doping concentration index of the first lightly doped region is in a range from 1 to 100;

the doping concentration index of the second heavily doped region is in a range from 10 to $1\times10^7$, and the doping concentration index of the second lightly doped region is in a range from 1 to 100; and the preset depth range is from 90 nm to 110 nm.

2. The solar cell according to claim 1, wherein the first heavily doped region comprises a first heavily doped sub-region, and second heavily doped sub-regions located at opposite sides of the first heavily doped sub-region respectively along a first object direction; a doping concentration index of the first heavily doped sub-region is greater than a doping concentration index of each second heavily doped sub-region; the first object direction, an extension direction of the first heavily doped region, and the thickness direction of the substrate are perpendicular to each other; and the second heavily doped region comprises a third heavily doped sub-region, and fourth heavily doped sub-regions located at opposite sides of the third heavily doped sub-region respectively along a second object direction; a doping concentration index of the third heavily doped sub-region is greater than a doping concentration index of each fourth heavily doped sub-region; the second object direction, an extension direction of the second heavily doped region, and the thickness direction of the substrate are perpendicular to each other.

3. The solar cell according to claim 2, wherein at least one of limitations that the doping concentration index of the first heavily doped sub-region is in a range from 10 to $1\times10^7$, and the doping concentration index of the second heavily doped sub-region is in a range from 5 to $5\times10^6$; or that the doping concentration index of the third heavily doped sub-region is in a range from 10 to $1\times10^7$, and the doping concentration index of each fourth heavily doped sub-region is in a range from 5 to $5\times10^6$, is satisfied.

4. The solar cell according to claim 1, wherein the first heavily doped region is closer to the second surface than the first lightly doped region along the thickness direction of the substrate; or the first heavily doped region is farther away from the second surface than the first lightly doped region along the thickness direction of the substrate.

5. The solar cell according to claim 1, wherein a side of the first heavily doped region away from the second surface is flush with a side of the first lightly doped region away from the second surface along the thickness direction of the substrate.

6. The solar cell according to claim 4, wherein a distance, along the thickness direction of the substrate and between a side of the first heavily doped region away from the second surface and a side of the first lightly doped region away from the second surface, is a first distance, and the first distance is in a range from 1 μm to 10 μm.

7. The solar cell according to claim 1, wherein the second heavily doped region is closer to the first surface than the second lightly doped region along the thickness direction of the substrate; or the second heavily doped region is farther away from the first surface than the second lightly doped region along the thickness direction of the substrate.

8. The solar cell according to claim 1, wherein a side of the second heavily doped region away from the first surface is flush with a side of the second lightly doped region away from the first surface along the thickness direction of the substrate.

9. The solar cell according to claim 7, wherein, a distance, along the thickness direction of the substrate and between a side of the second heavily doped region away from the first surface and a side of the second lightly doped region away from the first surface, is a second distance, and the second distance is in a range from 1 μm to 10 μm.

10. The solar cell according to claim 1, wherein the first heavily doped region and the first lightly doped region are both configured to extend along one of a first direction and a second direction, and the first heavily doped region and the first lightly doped region are alternately arranged along the other of a first direction and a second direction;

wherein, the first direction and the second direction intersect each other and are both perpendicular to the thickness direction of the substrate.

11. The solar cell according to claim 10, wherein the second heavily doped region and the second lightly doped region are both configured to extend along one of a first direction and a second direction, and the second heavily doped region and the second lightly doped region are alternately arranged along the other of the first direction and the second direction.

12. The solar cell according to claim 11, wherein each of the first heavily doped region, the first lightly doped region, the second heavily doped region, and the second lightly doped region is configured to extend along the first direction; the first heavily doped region and the first lightly doped region are alternately arranged along the second direction, and the second heavily doped region and the second lightly doped region are alternately arranged along the second direction; the first heavily doped region and the second heavily doped region are arranged in a staggered pattern along the second direction; and the first lightly doped region and the second lightly doped region are arranged in a staggered pattern along the second direction; or each of the first heavily doped region, the first lightly doped region, the second heavily doped region, and the second lightly doped region is configured to extend along the second direction; the first heavily doped region and the first lightly doped region are alternately arranged along the first direction, and the second heavily doped region and the second lightly doped region are alternately arranged along the first direction; the first heavily doped region and the second heavily doped region are arranged in a staggered pattern along the first direction; and the first lightly doped region and the second lightly doped region are arranged in a staggered pattern along the first direction.

13. The solar cell according to claim 1, wherein the substrate further has side surfaces each connected between the first surface and the second surface; and at least one of the first heavily doped region and the second heavily doped region is configured to extend to each side surface and connected to each side surface.

14. The solar cell according to claim 13, wherein at least one of limitations that a portion of the first heavily doped region extending to a corresponding side surface is adapted to extend from a side proximate to the first surface to a side proximate to the second surface, or that a portion of the second heavily doped region extending to a corresponding side surface is adapted to extend from a side proximate to the second surface to a side proximate to the first surface, is satisfied.

15. The solar cell according to claim 13, wherein at least one of limitations that a portion of the first heavily doped region extending to the corresponding side surface is arranged to surround the corresponding side surface, or that a portion of the second heavily doped region extending to the corresponding side surface is arranged to surround the corresponding side surface, is satisfied.

16. The solar cell according to claim 13, wherein the emitter structure comprises a plurality of first heavily doped regions and a plurality of first lightly doped regions, and the doped conductive structure comprises a plurality of second heavily doped regions and a plurality of second lightly doped regions;

the plurality of first heavily doped regions and the plurality of first lightly doped regions are alternately arranged along a first object direction; the first object direction, an extension direction of the first heavily doped regions, and the thickness direction of the substrate are perpendicular to each other; there is a first central heavily doped region among the plurality of first heavily doped regions; D1 denotes a dimension of the first central heavily doped region along the first object direction, and D2 denotes a dimension of each of remaining first heavily doped regions among the plurality of first heavily doped regions except the first central heavily doped region along the first object direction, and it is satisfied that D1>D2; and the plurality of second heavily doped regions and the plurality of second lightly doped regions are alternately arranged along a second object direction; the second object direction, an extension direction of the second heavily doped region, and the thickness direction of the substrate are perpendicular to each other; there is a second central heavily doped region among the plurality of second heavily doped regions; D3 denotes a dimension of the second central heavily doped region along the second object direction, and D4 denotes a dimension of each of remaining second heavily doped regions among the plurality of second heavily doped regions except the second central heavily doped region along the second object direction, and it is satisfied that D3>D4.

17. The solar cell according to claim 1, wherein the emitter structure comprises a plurality of first heavily doped regions and a plurality of first lightly doped regions; and S1 denotes a sum of orthographic projection areas of the plurality of first heavily doped regions on the substrate, and S2 denotes a sum of orthographic projection areas of the plurality of first lightly doped regions on the substrate; S1 and S2 have the same unit, and S1 and S2 satisfy that S1/S2=a1, wherein a1 is in a range from 10% to 50%.

18. The solar cell according to claim 1, wherein, the doped conductive structure comprises a plurality of second heavily doped regions and a plurality of second lightly doped regions; and S3 denotes a sum of orthographic projection areas of the plurality of second heavily doped regions on the substrate, and S4 denotes a sum of orthographic projection areas of the plurality of second lightly doped regions on the substrate; S3 and S4 have the same unit, and S3 and S4 satisfy that S3/S4=a2, wherein a2 is in a range from 10% to 50%.

19. A photovoltaic module, comprising the solar cell according to claim 1.

* * * * *